(12) United States Patent
Mun (10) Patent No.: US 12,507,424 B2
(45) Date of Patent: Dec. 23, 2025

(54) SEMICONDUCTOR PACKAGE

(71) Applicant: SAMSUNG ELECTRONICS CO., LTD., Suwon-si (KR)

(72) Inventor: Kyung Don Mun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 18/091,832

(22) Filed: Dec. 30, 2022

(65) Prior Publication Data

US 2023/0320106 A1     Oct. 5, 2023

(30) Foreign Application Priority Data

Apr. 4, 2022    (KR) .................. 10-2022-0041779

(51) Int. Cl.
  *H10B 12/00*   (2023.01)
  *H10B 80/00*   (2023.01)

(52) U.S. Cl.
  CPC ........... *H10B 80/00* (2023.02); *H10B 12/315* (2023.02)

(58) Field of Classification Search
  CPC ... H10B 80/00; H10B 12/315; H01L 23/6384; H01L 23/552
  See application file for complete search history.

(56) References Cited

U.S. PATENT DOCUMENTS

| | | |
|---|---|---|
| 8,116,100 B2 | 2/2012 | Saen et al. |
| 9,535,831 B2 | 1/2017 | Jayasena et al. |
| 10,361,173 B2 * | 7/2019 | Lin .................. H01L 25/18 |
| 10,908,820 B2 | 2/2021 | Malladi et al. |
| 11,094,371 B2 | 8/2021 | O et al. |
| 11,194,579 B2 | 12/2021 | Shin et al. |

(Continued)

FOREIGN PATENT DOCUMENTS

| | | |
|---|---|---|
| KR | 10-2020-0059516 A | 5/2020 |
| KR | 10-2021-0092467 A | 7/2021 |
| KR | 10-2021-0119548 A | 10/2021 |

OTHER PUBLICATIONS

Kwon, et al., "A 20nm 6GB Function-In-Memory DRAM, Based on HBM2 with a 1.2TFLOPS Programmable Computing Unit Using Bank-Level Parallelism, for Machine Learning Applications", ISSCC 2021, IEEE International Solid-State Circuits Conference, Session 25, Feb. 18, 2021, pp. 350-352.

*Primary Examiner* — Thao P Le
(74) *Attorney, Agent, or Firm* — Sughrue Mion, PLLC (57) ABSTRACT

A semiconductor package includes first and second semiconductor dies on a buffer die. The first semiconductor die includes first memory blocks on a first semiconductor substrate, a first interlayer dielectric layer, a first through via penetrating the first semiconductor substrate and connected to the buffer die, and first conductive pads on the first interlayer dielectric layer and connected to the first memory blocks. The second semiconductor die includes first calculation blocks on a second semiconductor substrate and configured to calculate data received from the first memory blocks and store results to the first memory blocks, a second interlayer dielectric layer, and second conductive pads below the second interlayer dielectric layer and connected to the first calculation blocks. A top surface of the first interlayer dielectric layer contacts the second interlayer dielectric layer. The first conductive pads contact the second conductive pads.

20 Claims, 8 Drawing Sheets

(56) References Cited

U.S. PATENT DOCUMENTS

| | | | |
|---|---|---|---|
| 11,195,817 B2* | 12/2021 | Huang | H01L 23/5383 |
| 2009/0070727 A1 | 3/2009 | Solomon | |
| 2013/0073755 A1 | 3/2013 | Sadowski et al. | |
| 2020/0365486 A1* | 11/2020 | Huang | H01L 21/56 |
| 2021/0157582 A1 | 5/2021 | Agrawal et al. | |
| 2021/0157751 A1 | 5/2021 | Kwon et al. | |
| 2021/0208878 A1 | 7/2021 | Son et al. | |
| 2021/0225430 A1 | 7/2021 | O | |
| 2021/0247978 A1 | 8/2021 | Malladi et al. | |
| 2021/0249396 A1 | 8/2021 | Brewer | |
| 2021/0280487 A1* | 9/2021 | Chen | H01L 25/0657 |
| 2022/0399316 A1* | 12/2022 | Choi | H01L 23/5383 |
| 2024/0006382 A1* | 1/2024 | Jang | H01L 24/16 |
| 2024/0120318 A1* | 4/2024 | Mun | H01L 23/3107 |
| 2024/0413026 A1* | 12/2024 | Ko | H01L 23/49816 |
| 2025/0062210 A1* | 2/2025 | Kim | H01L 25/0655 |
| 2025/0087646 A1* | 3/2025 | Chung | H01L 23/49811 |
| 2025/0096214 A1* | 3/2025 | Chung | H01L 23/5389 |
| 2025/0192109 A1* | 6/2025 | Chung | H01L 24/73 |

* cited by examiner

SEMICONDUCTOR PACKAGE

CROSS-REFERENCE TO RELATED APPLICATION

This application claims priority under 35 U.S.C. § 119 to Korean Patent Application No. 10-2022-0041779, filed on Apr. 4, 2022, in the Korean Intellectual Property Office, the disclosure of which is incorporated by reference herein in its entirety.

BACKGROUND

The present disclosure relates to a semiconductor package.

A semiconductor package is provided to implement an integrated circuit chip to qualify for use in electronic products. Typically, a semiconductor package is configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

One or more example embodiments provide a semiconductor package with increased reliability and optimized performance.

Additional aspects will be set forth in part in the description which follows and, in part, will be apparent from the description, or may be learned by practice of the presented embodiments.

According to an aspect of an example embodiment, a semiconductor package includes: a buffer die; and a first semiconductor die and a second semiconductor die that are sequentially stacked on the buffer die, wherein the first semiconductor die includes: a first semiconductor substrate; a plurality of first memory blocks provided on the first semiconductor substrate; a first interlayer dielectric layer that covers the first semiconductor substrate and the plurality of first memory blocks; a first through via that penetrates the first semiconductor substrate and is connected to the buffer die; and a plurality of first conductive pads provided on the first interlayer dielectric layer and connected to the plurality of first memory blocks, wherein the second semiconductor die includes: a second semiconductor substrate; a plurality of first calculation blocks provided on the second semiconductor substrate, the plurality of first calculation blocks being configured to calculate data received from the plurality of first memory blocks and store calculated results in the plurality of first memory blocks; a second interlayer dielectric layer that covers the second semiconductor substrate and the plurality of first calculation blocks; and a plurality of second conductive pads provided below the second interlayer dielectric layer and connected to the plurality of first calculation blocks, wherein a top surface of the first interlayer dielectric layer contacts the second interlayer dielectric layer, and wherein each first conductive pad of the plurality of first conductive pads contacts a corresponding second conductive pad of the plurality of second conductive pads.

According to an aspect of an example embodiment, a semiconductor package includes: a package substrate; an interposer substrate provided on the package substrate; a buffer die provided on the interposer substrate; a first memory die and a second memory die that are sequentially stacked on the buffer die; a third memory die, a first calculation die, a fourth memory die, and a second calculation die that are sequentially stacked on the second memory die; a third calculation die provided on the interposer substrate and on a side of the buffer die; a thermal radiation member provided on the second calculation die and the third calculation die; and a thermal interface material layer provided between the second calculation die and the thermal radiation member and between the third calculation die and the thermal radiation member, wherein the third memory die includes a plurality of first memory blocks, wherein the first calculation die includes a plurality of first calculation blocks configured to calculate data received from the plurality of first memory blocks and store calculated results in the plurality of first memory blocks, wherein the fourth memory die includes a plurality of second memory blocks, and wherein the second calculation die includes a plurality of second calculation blocks, and the plurality of second calculation blocks calculate data received from the plurality of second memory blocks and store calculated results in the plurality of second memory blocks.

According to an aspect of an example embodiment, a semiconductor package includes: a buffer die; and a first memory die, a first calculation die, a second memory die, and a second calculation die that are sequentially stacked on the buffer die, wherein the first memory die includes a plurality of first memory blocks, wherein the first calculation die includes a plurality of first calculation blocks configured to calculate data received from the plurality of first memory blocks and store calculated results in the plurality of first memory blocks, wherein the second memory die includes a plurality of second memory blocks, wherein the second calculation die includes a plurality of second calculation blocks configured to calculate data received from the plurality of second memory blocks and store calculated results in the plurality of second memory blocks, wherein each of the first memory die and the second memory die has a first thickness, wherein the first calculation die has a second thickness, and wherein the second calculation die has a third thickness that is greater than the first thickness and the second thickness.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Some embodiments of the disclosure will now be described in detail with reference to the accompanying drawings to aid in clearly explaining the disclosure. In this description, such terms as "first" and "second" may be used to simply distinguish identical or similar components from each other, and the sequence of such terms may be changed in accordance with the order of mention.

Figure 1:
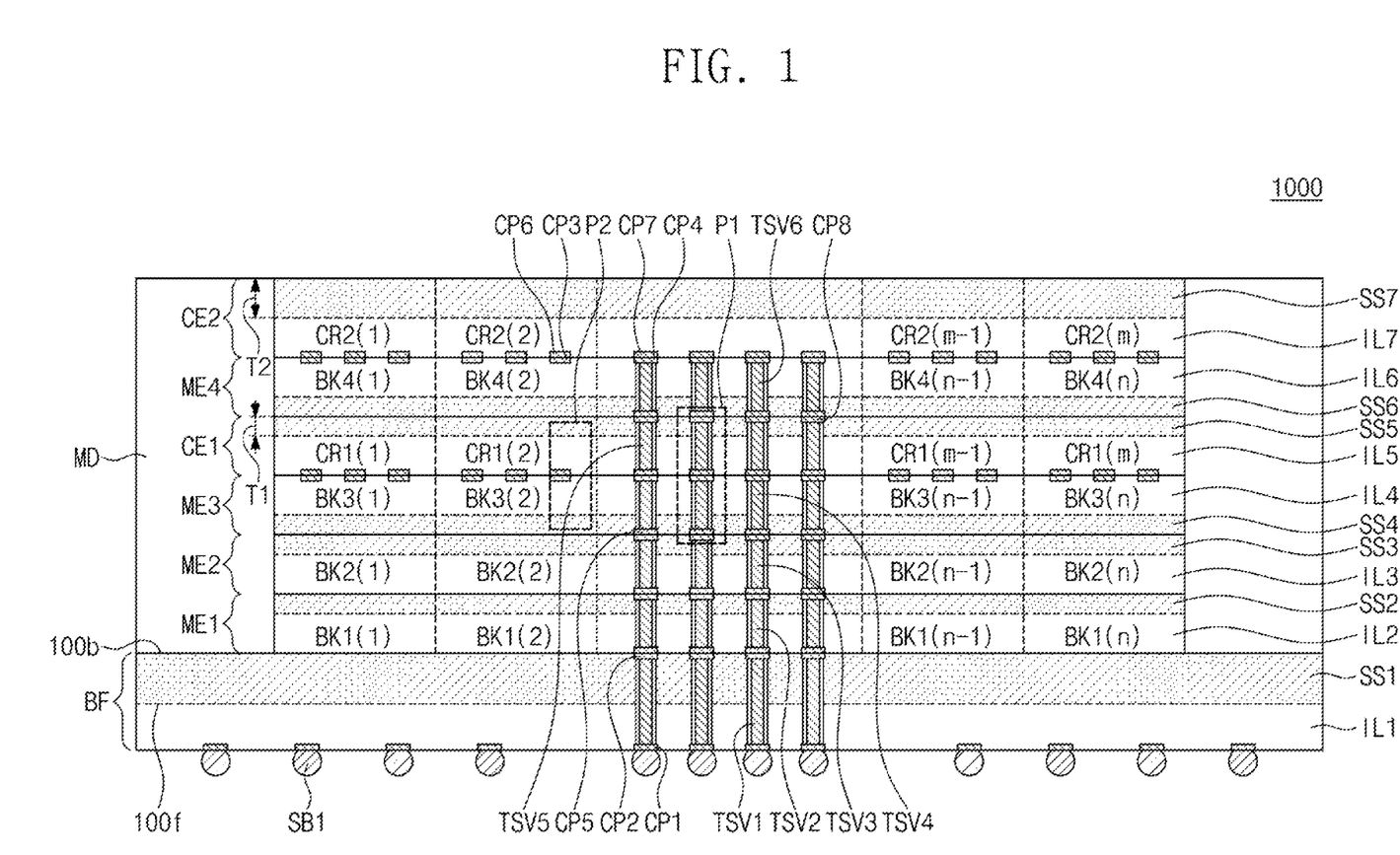
FIG. 1 illustrates a cross-sectional view showing a semiconductor package according to an example embodiment.
Figure 2:
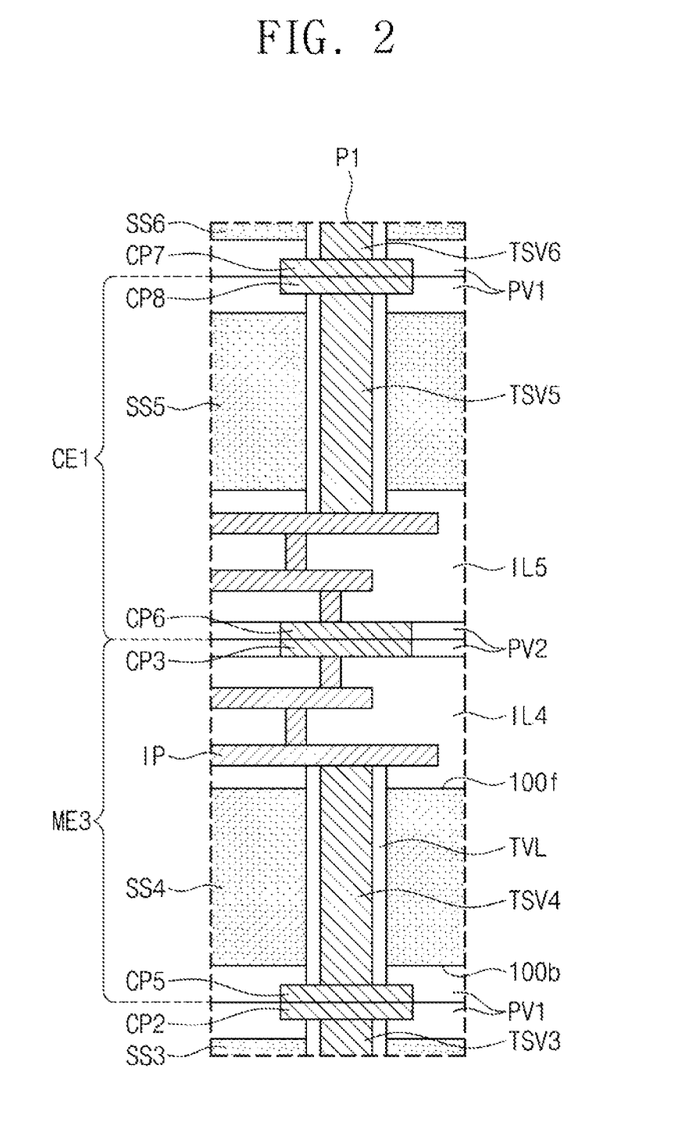
FIG. 2 illustrates an enlarged view showing section P1 of FIG. 1.

FIG. 1 illustrates a cross-sectional view showing a semiconductor package according to an example embodiment. FIG. 2 illustrates an enlarged view showing section P1 of FIG. 1.

Referring to FIGS. 1 and 2, a semiconductor package 1000 according to the present example embodiment may include a first memory die ME1, a second memory die ME2, a third memory die ME3, a first calculation die CE1, a fourth memory die ME4, and a second calculation die CE2 that are sequentially stacked on a buffer die BF. The buffer die BF, the first memory die ME1, the second memory die ME2, the third memory die ME3, the first calculation die CE1, the fourth memory die ME4, and the second calculation die CE2 may each be called a semiconductor die or a semiconductor chip.

The buffer die BF, the first memory die ME1, the second memory die ME2, the third memory die ME3, the first calculation die CE1, the fourth memory die ME4, and the second calculation die CE2 may respectively include semiconductor substrates SS1 to SS7 and interlayer dielectric layers IL1 to IL7. The buffer die BF may be replaced with an interposer substrate or a package substrate.

The first memory die MEL the second memory die ME2, the third memory die ME3, the first calculation die CE1, the fourth memory die ME4, and the second calculation die CE2 may have their sidewalls that are covered with a mold layer MD. The mold layer MD may include a dielectric resin, for example, an epoxy molding compound (EMC). The mold layer MD may further include fillers, and the fillers may be dispersed in the dielectric resin. The fillers may include, for example, silicon oxide ($SiO_2$).

Each of the semiconductor substrates SS1 to SS7 may have a first surface $100f$ (shown as a dashed line in FIG. 1) and a second surface $100b$ (shown as a solid line in FIG. 1) that are opposite to each other.

Each of the semiconductor substrates SS1 to SS7 may be a single-crystalline semiconductor substrate or a silicon-on-insulator (SOI) substrate. The interlayer dielectric layers IL1 to IL7 may cover the first surfaces $100f$ of the semiconductor substrates SS1 to SS7. The second surfaces $100b$ of the semiconductor substrates SS1 to SS7 may be correspondingly covered with first passivation layers PV1. The interlayer dielectric layers IL1 to IL7 may be correspondingly covered with second passivation layers PV2. The interlayer dielectric layers IL1 to IL7 may each have a single-layered or multi-layered structure including at least one selected from silicon oxide, silicon nitride, silicon oxynitride, and porous dielectric. The first passivation layers PV1 and the second passivation layers PV2 may each have a single-layered or multi-layered structure including at least one selected from silicon oxide and silicon nitride.

The buffer die BF, the first memory die ME1, the second memory die ME2, the third memory die ME3, the first calculation die CE1, the fourth memory die ME4, and the second calculation die CE2 may respectively include through vias TSV1 to TSV6. The through vias TSV1 to TSV6 may penetrate the buffer die BF, the first memory die ME1, the second memory die ME2, the third memory die ME3, the first calculation die CE1, the fourth memory die ME4, and the second calculation die CE2, respectively. Via dielectric layers TVL may be correspondingly interposed between the through vias TSV1 to TSV6 and the semiconductor substrates SS1 to SS7. The through vias TSV1 to TSV6 may include metal, such as copper, aluminum, and tungsten. The via dielectric layer TVL may have a single-layered or multi-layered structure including at least one selected from silicon oxide, silicon nitride, and silicon oxynitride. The via dielectric layer TVL may include an air gap. The second calculation die CE2 may include no through via. The semiconductor substrate SS5 of the first calculation die CE1 may have a first thickness T1. The semiconductor substrate SS7 of the second calculation die CE2 may have a second thickness T2 greater than the first thickness T1.

Multi-layered internal lines IP may be disposed in the interlayer dielectric layers IL1 to IL7. The internal line IP may have a single-layered or multi-layered structure including at least one selected from copper, aluminum, tungsten, titanium, titanium nitride, tantalum, tantalum nitride, ruthenium, and iridium. The internal lines IP may be connected to respective through vias TSV1 to TSV6 that penetrate corresponding dies BF to ME4.

The buffer die BF and the first and second memory dies ME1 and ME2 may each include first conductive pads CP1 disposed on a bottom end thereof. The buffer die BF and the first and second memory dies ME1 and ME2 may each include second conductive pads CP2 disposed on a top end thereof. The first conductive pads CP1 and the second conductive pads CP2 may contact or overlap the first to third through vias TSV1 to TSV3. First external connection members SB1 may be bonded to some of (e.g., at least one of) the first conductive pads CP1 of the buffer die BF. The first external connection members SB1 may include at least one selected from copper bumps, copper pillars, and solder balls. The second conductive pads CP2 of the buffer die BF may be in direct contact with the first conductive pads CP1 of the first memory die ME1. The second conductive pads CP2 of the first memory die ME1 may be in direct contact with the first conductive pads CP1 of the second memory die ME2.

Each of the third and fourth memory dies ME3 and ME4 may include third and fourth conductive pads CP3 and CP4 on a top end thereof. The third and fourth conductive pads CP3 and CP4 may be spaced apart from each other. Each of the third and fourth memory dies ME3 and ME4 may include fifth conductive pads CP5 disposed on a bottom end thereof. The fifth conductive pads CP5 of the third memory die ME3 may be in direct contact with the second conductive pads CP2 of the second memory die ME2.

Each of the first and second calculation dies CE1 and CE2 may include sixth and seventh conductive pads CP6 and CP7 disposed on a bottom end thereof. The first calculation die CE1 may include eighth conductive pads CP8 disposed on a top end thereof. The first to eighth conductive pads CP1 to CP8 may include at least one metal selected from copper, gold, nickel, tin, silver, tungsten, and aluminum.

The third conductive pads CP3 of the third memory die ME3 may be in direct contact with the sixth conductive pads CP6 of the first calculation die CE1. The fourth conductive pads CP4 of the third memory die ME3 may be in direct contact with the seventh conductive pads CP7 of the first calculation die CE1. The eighth conductive pads CP8 of the first calculation die CE1 may be in direct contact with the fifth conductive pads CP5 of the fourth memory die ME4.

The third conductive pads CP3 of the fourth memory die ME4 may be in direct contact with the sixth conductive pads CP6 of the second calculation die CE2. The fourth conductive pads CP4 of the fourth memory die ME4 may be in direct contact with the seventh conductive pads CP7 of the second calculation die CE2.

Contacted ones of the first to eighth conductive pads CP1 to CP8 may be merged into a single unitary body. Therefore, no interface may be present between the contacted ones of the first to eighth conductive pads CP1 to CP8.

The buffer die BF may be called an interface die, a logic die, or a master die. The die may be called a chip. The buffer die BF may serve as an interface circuit between an external controller and the first memory die ME1, the second memory die ME2, the third memory die ME3, the first calculation die CE1, the fourth memory die ME4, and the second calculation die CE2. The buffer die BF may receive commands, data, and signals transmitted from the external controller, and may transfer the received command, data, and signals through the through vias TSV1 to TSV6 to the first memory die ME1, the second memory die ME2, the third memory die ME3, the first calculation die CE1, the fourth memory die ME4, and the second calculation die CE2. The buffer die BF may provide the external controller with data that are output from the first memory die ME1, the second memory die ME2, the third memory die ME3, the first calculation die CE1, the fourth memory die ME4, and the second calculation die CE2. The buffer die BF may include interface circuits, buffering circuits, or a physical layer (PHY) that receive and amplify the signals.

The first memory die ME1, the second memory die ME2, the third memory die ME3, and the fourth memory die ME4 may each be, for example, a dynamic random access memory (DRAM). The first memory die ME1, the second memory die ME2, the third memory die ME3, and the fourth memory die ME4 may include n memory blocks BK1 to BK4, respectively, where n may be a natural number equal to or greater than 4. The memory dies ME1 to ME4 may have their respective different numbers of the memory blocks BK1 to BK4. Each of the memory blocks BK1 to BK4 may be called a bank. The memory blocks BK1 to BK4 may be respectively disposed on the semiconductor substrates SS2 to SS4 and SS6 of the memory dies ME1 to ME4.

Figure 3:
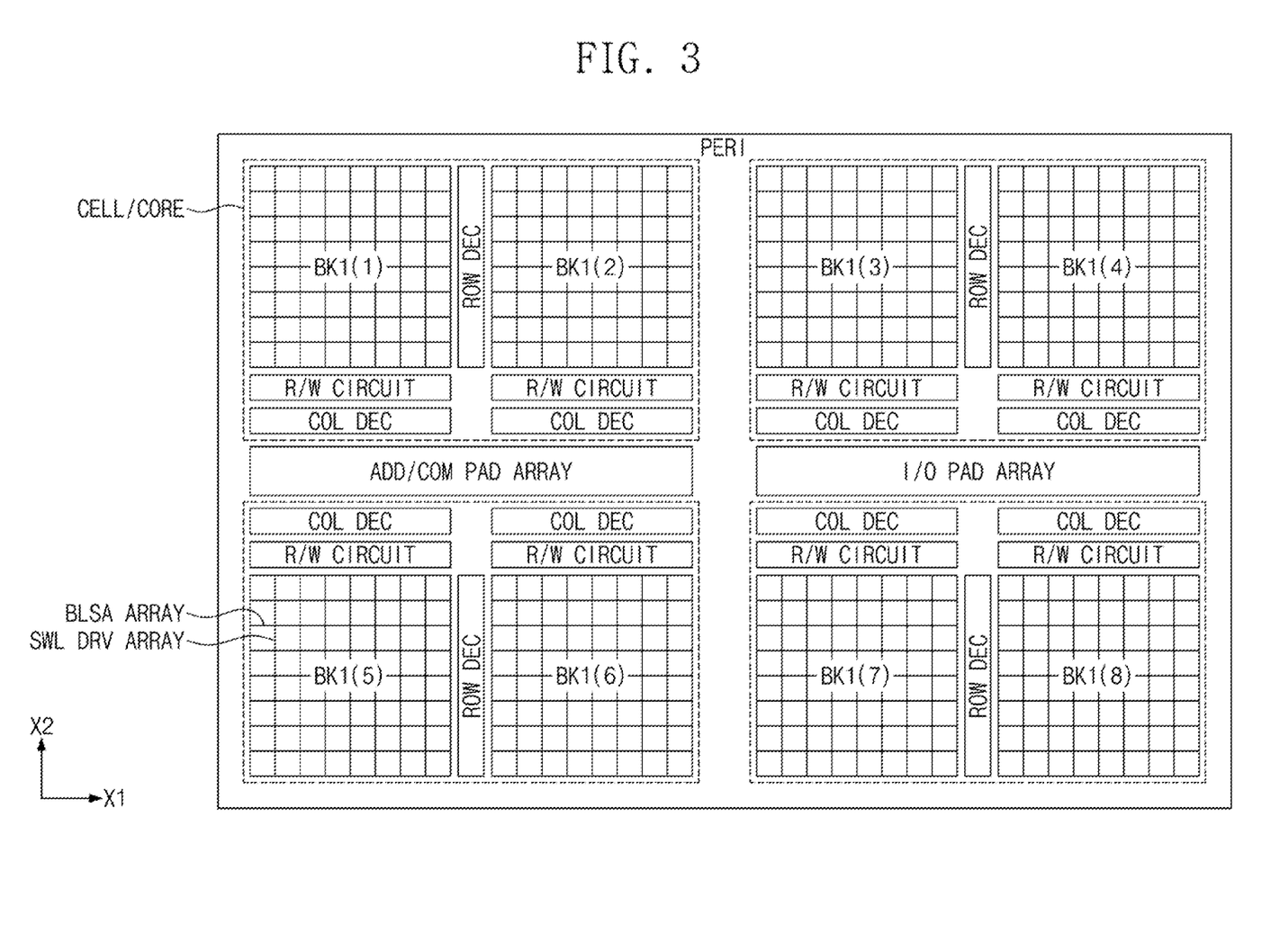
FIG. 3 illustrates a block diagram showing a memory die according to an example embodiment.
Figure 4:
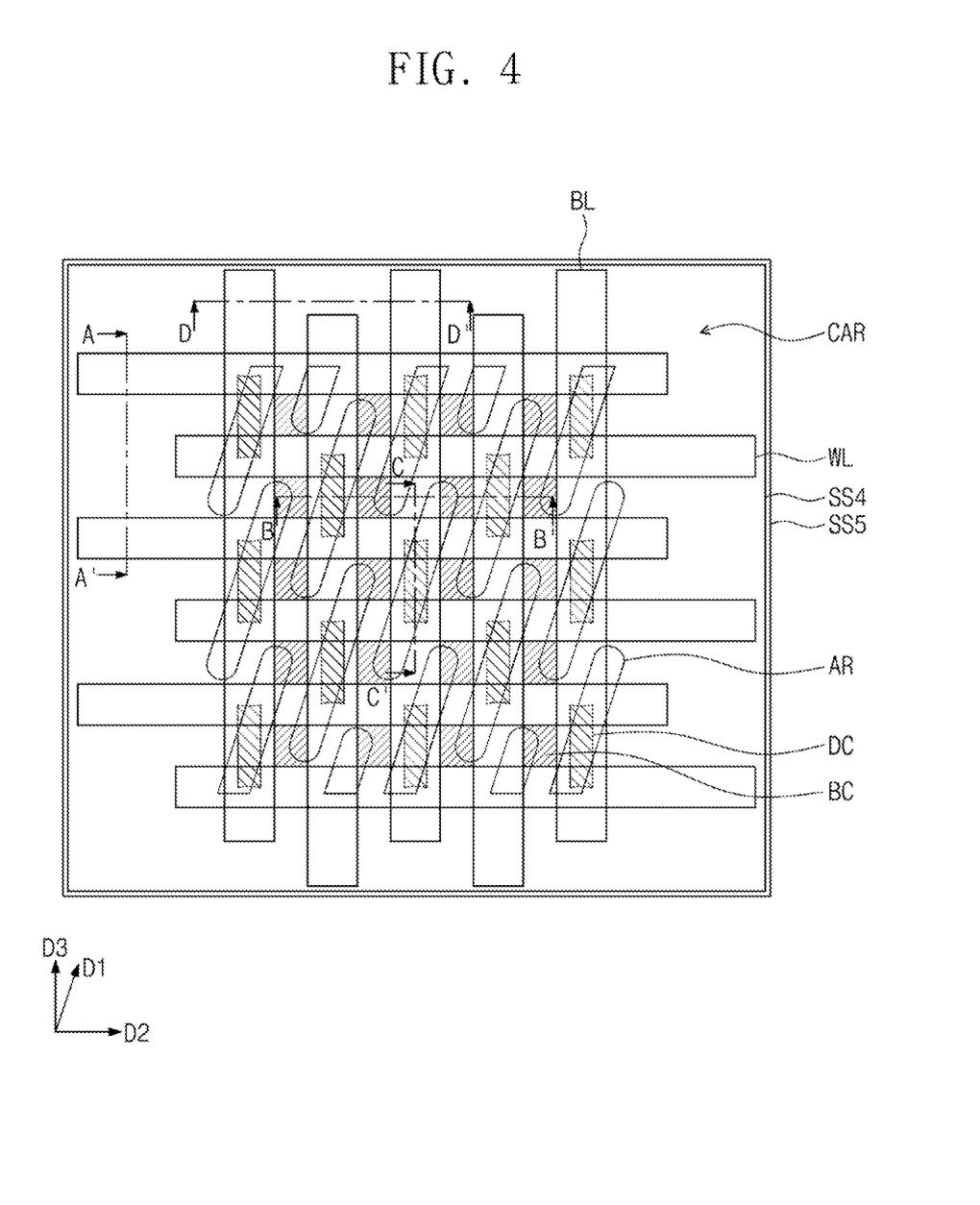
FIG. 4 illustrates a plan view showing a memory block according to an example embodiment.
Figure 5:
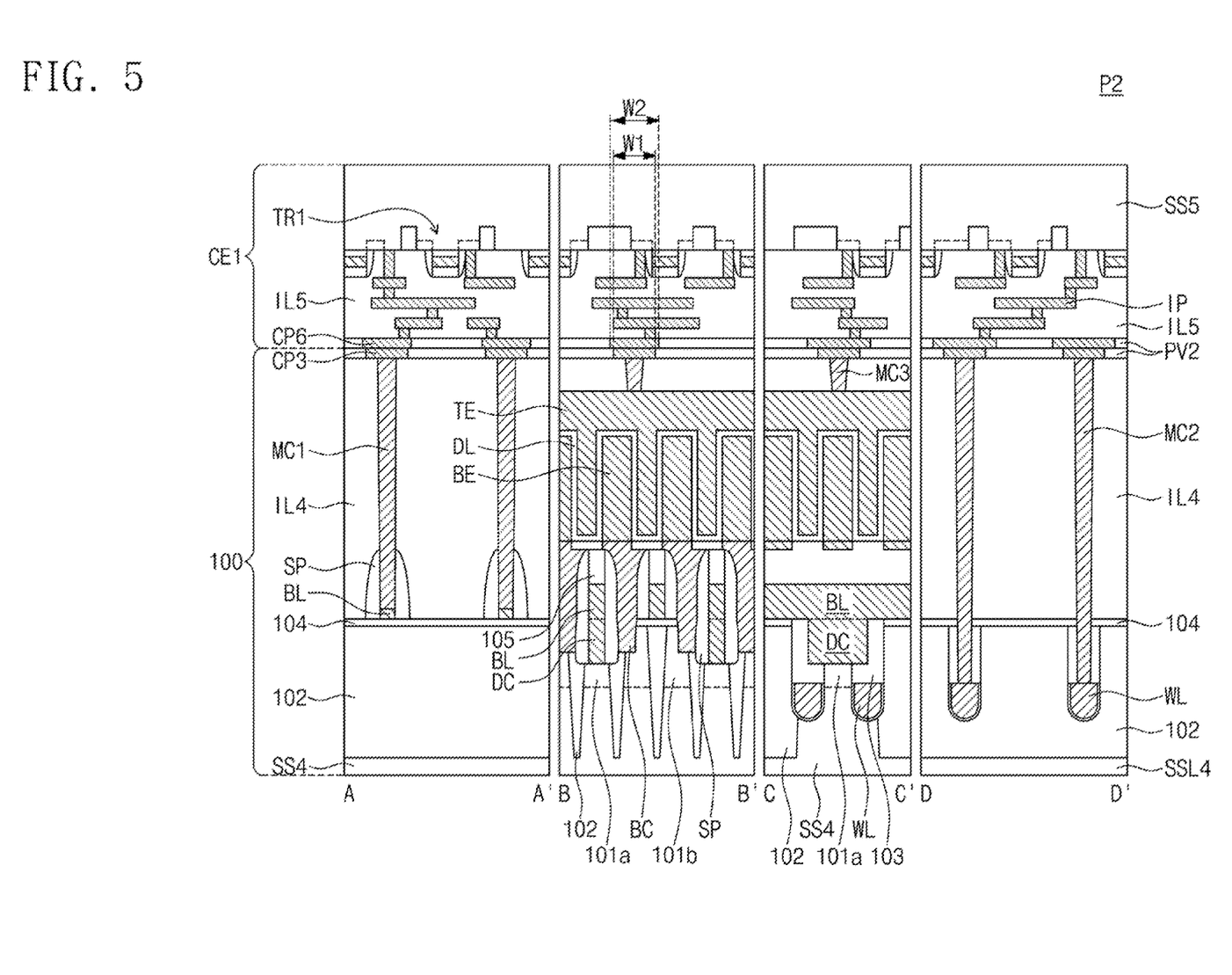
FIG. 5 illustrates an enlarged view showing section P1 of FIG. 1.

FIG. 3 illustrates a block diagram showing a memory die according an example embodiment. FIG. 4 illustrates a plan view showing a memory block according to an example embodiment. FIG. 5 shows cross-sections taken along lines A-A', B-B', C-C', and D-D' of FIG. 4 according to an example embodiment. FIG. 3 depicts by way of example a plan view of the first memory die ME1 among the first to fourth memory dies ME1 to ME4.

Referring to FIG. 3, the first memory die ME1 may include, for example, a cell/core region CELL/CORE and a peripheral region PERI. A plurality of first memory blocks BK1 may be disposed on the cell/core region CELL/CORE. The first memory blocks BK1 may each include memory cell arrays CAR of FIG. 4. The cell/core region CELL/CORE may be divided into four sub-regions that are surrounded by the peripheral region PERI on a semiconductor substrate. For example, the peripheral region PERI may limit the cell/core region CELL/CORE. Two first memory blocks BK1 may be included in each sub-region CELL/CORE surrounded by the peripheral region PERI.

For a left-top cell/core region CELL/CORE of four divided cell/core regions CELL/CORE, a row decoder ROW DEC may be disposed between two first memory blocks BK1 that are adjacent to each other in a first direction X1. A read/write circuit R/W CIRCUIT and a column decoder COL DEC may be disposed between two first memory blocks BK1 that are adjacent to each other in a second direction X2. As shown in FIG. 3, the two first memory blocks BK1 between which the read/write circuit R/W CIRCUIT and column decoder COL DEC are disposed may belong to different cell/core regions CELL/CORE. At least one read/write circuit R/W CIRCUIT may be disposed adjacent to each of the first memory blocks BK1, for example, in the second direction X2. As shown in FIG. 3, in the cell/core region CELL/CORE, the read/write circuit R/W CIRCUIT may be disposed adjacent to the peripheral region PERI. FIG. 3 depicts that the read/write circuits R/W CIRCUIT are disposed to face each other across an address/command pad array ADD/COM PAD ARRAY and an input/output pad array I/O PAD ARRAY of the peripheral region PERI, but this is by way of example only. In accordance with design, the read/write circuit R/W CIRCUIT may have various arrangements in the cell/core region CELL/CORE. For example, the read/write circuit R/W CIRCUIT may be disposed to rest on an edge portion of the semiconductor substrate SS2, to extend not in a row direction but in a column direction, or to be concentrated on a certain spot.

The first memory block BK1 may include a bit-line sense amplifier array BLSA ARRAY and a sub-word-line driver array SWL DRV ARRAY. The bit-line sense amplifier array BLSA ARRAY may be disposed in the second direction X2 between the first memory blocks BK1 and the column decoder COL DEC, and the sub-word-line driver array SWL DRV ARRAY may be disposed in the first direction X1 between the first memory blocks BK1 and the row decoder ROW DEC.

The peripheral region PERI may be provided thereon with a timing resistor, an address resistor, a data input resistor, a data output resistor, and data input/output terminals. FIG. 3 shows that the peripheral region PERI is provided thereon with the address/command pad array ADD/COM PAD ARRAY having an address input terminal to which an address signal is input and a command input terminal to which a command signal is input, and with the input/output pad array I/O PAD ARRAY having a data input/output terminal to which a data signal is input. An address signal and a command signal may be input in common to an input terminal disposed on the address/command pad array ADD/COM PAD ARRAY.

The arrangement shown in FIG. 3 is only an example, and may be variously changed without limiting embodiments of the present disclosure. Each of the second, third, and fourth memory dies ME2, ME3, and ME4 may have a structure the same as or similar to that of the first memory die ME1 discussed with reference to FIG. 3. Alternatively, the second memory die ME2 may have a structure the same as that of the first memory die ME1, and the third and fourth memory dies ME3 and ME4 may have their structures different from that of the first memory die ME1.

The first calculation die CE1 and the second calculation die CE2 may include m calculation blocks CR1 and CR2, respectively. The m may be a natural number equal to or greater than 4. The m may be the same as or different from the n. The first calculation die CE1 and the second calculation die CE2 may have their respective different numbers of the calculation blocks CR1 and CR2. The calculation blocks CR1 and CR2 may include one or more calculation units. The calculation units may perform calculation, such as max pooling, rectified linear unit (ReLU), and channel-wise addition.

The first calculation blocks CR1 of the first calculation die CE1 may overlap or not overlap the third memory blocks BK3 of the third memory die ME3. The first calculation blocks CR1 of the first calculation die CE1 may calculate data received from the third memory blocks BK3 of the third memory die ME3, and may store results back to the third memory blocks BK3 of the third memory die ME3. The first calculation blocks CR1 of the first calculation die CE1 may be connected to the third memory blocks BK3 of the third memory die ME3 through the third conductive pads CP3 and the sixth conductive pads CP6. For example, data generated from a first third memory block BK3(1) of the third memory die ME3 may be transmitted to a first first calculation block CR1(1) of the first calculation die CE1 through the third conductive pads CP3 and the sixth conductive pads CP6 positioned on the first third memory block BK3(1) (e.g., positioned between the first third memory block BK3(1) and the first first calculation block CR1(1)), and after calculation in the first first calculation block CR1(1), a result may be stored back to the first third memory block BK3(1) of the third memory die ME3 through the third conductive pads CP3 and the sixth conductive pads CP6.

As the first calculation blocks CR1 of the first calculation die CE1 are connected through the third conductive pads CP3 and the sixth conductive pads CP6 to the third memory blocks BK3 of the third memory die ME3, there may be a reduced signal distance between the first calculation blocks CR1 of the first calculation die CE1 and the third memory blocks BK3 of the third memory die ME3, which may result in an increase in processing/operating speed.

The second calculation blocks CR2 of the second calculation die CE2 may overlap or not overlap the fourth memory blocks BK4 of the fourth memory die ME4. The second calculation blocks CR2 of the second calculation die CE2 may calculate data received from the fourth memory blocks BK4 of the fourth memory die ME4, and may store results back to the fourth memory blocks BK4 of the fourth memory die ME4. The second calculation blocks CR2 of the second calculation die CE2 may be connected to the fourth memory blocks BK4 of the fourth memory die ME4 through the third conductive pads CP3 and the sixth conductive pads CP6 to the fourth memory blocks BK4 of the fourth memory die ME4. For example, data generated from a first fourth memory block BK4(1) of the fourth memory die ME4 may be transmitted to a first second calculation block CR2(1) of the second calculation die CE2 through the third conductive pads CP3 and the sixth conductive pads CP6 positioned on the first fourth memory block BK4(1) (e.g., positioned between the first fourth memory block BK4(1) and the first second calculation block CR2(1)), and after calculation in the first second calculation block CR2(1), a result may be stored back to the first fourth memory block BK4(1) of the fourth memory die ME4 through the third conductive pads CP3 and the sixth conductive pads CP6.

As the second calculation blocks CR2 of the second calculation die CE2 are connected through the third conductive pads CP3 and the sixth conductive pads CP6 to the fourth memory blocks BK4 of the fourth memory die ME4, there may be a reduced signal distance between the second calculation blocks CR2 of the second calculation die CE2 and the fourth memory blocks BK4 of the fourth memory die ME4, which may result in an increase in processing/operating speed.

The first and second calculation blocks CR1 and CR2 of the first and second calculation dies CE1 and CE2 may not be connected to the first and second memory blocks BK1 and BK2 of the first and second memory dies ME1 and ME2.

As the semiconductor package 1000 is configured such that the memory dies ME3 and ME4 are provided thereon with the calculation dies CE1 and CE2 whose amount of thermal radiation is relatively greater than that of the memory dies ME1 to ME4, the semiconductor package 1000 may be effective in terms of thermal radiation. Accordingly, the semiconductor package 1000 may increase in reliability and operating speed.

The first memory blocks BK1 of the first memory die ME1 and the second memory blocks BK2 of the second memory die ME2 may be controlled through the buffer die BF by an external controller.

The first and second memory dies ME1 and ME2 may be omitted from the semiconductor package 1000, and the third memory die ME3 may be in direct contact with the buffer die BF. Moreover, in this case, a structure in which the third memory die ME3 and the first calculation die CE1 are stacked may be stacked in three or more layers.

The peripheral region PERI discussed with reference to FIG. 3 may be excluded from each of the third and fourth memory dies ME3 and ME4. Additionally or alternatively, each of the third and fourth memory dies ME3 and ME4 may exclude at least one selected from the row decoder ROW DEC, the read/write circuit R/W CIRCUIT, and the column decoder COL DEC that are discussed with reference to FIG. 3. Each of the first calculation die CE1 and the second calculation die CE2 may include at least one selected from the peripheral region PERI, the row decoder ROW DEC, the read/write circuit R/W CIRCUIT, and the column decoder COL DEC that are excluded from the third and fourth memory dies ME3 and ME4. Therefore, each of the third and fourth memory dies ME3 and ME4 may have a reduced horizontal size. Accordingly, it may be possible to reduce form factors of semiconductor memory devices. Furthermore, it may be possible to increase the degree of freedom of design.

FIGS. 4 and 5 show by way of example a plan view and a cross-sectional view in each of which the third memory die ME3 and the first calculation die CE1 overlap each other. A plan view and a cross-sectional view in each of which the fourth memory die ME4 and the second calculation die CE2 overlap each other may be the same as or similar to FIGS. 4 and 5, respectively.

Referring to FIGS. 4 and 5, the third memory die ME3 may be provided on its fourth semiconductor substrate SSL4 with a device isolation layer 102 that defines active regions AR. Each of the active regions AR may have a bar shape elongated along a first direction D1. Word lines WL may be disposed on the fourth semiconductor substrate SSL4. The word lines WL may have their linear shapes extending in a second direction D2 that intersects the first direction D1. The word lines WL may be buried within the fourth semiconductor substrate SSL4. For example, top surfaces of the word lines WL may be lower than that of the fourth semiconductor substrate SSL4. The word lines WL may be covered with word-line capping patterns 103.

The fourth semiconductor substrate SSL4 may be provided thereon with first and second source/drain regions 101a and 101b that are spaced apart from each other. The first source/drain region 101a may be disposed on a side of one of the word lines WL, and the second source/drain region 101b may be disposed on another side of one of the word lines WL. The fourth semiconductor substrate SSL4 may be covered with a pad dielectric layer 104. A plurality of bit lines BL may be disposed on the pad dielectric layer 104. The bit lines BL may have their linear shapes that extend in a third direction D3 that intersects the first and second directions D1 and D2. The bit lines BL may each be covered with a bit-line capping pattern 105. A dielectric spacer SP may cover a sidewall or sidewalls of the bit line BL.

The bit line BL may be electrically connected to the first source/drain region 101a through a bit-line contact plug DC. A storage node contact plug BC may be disposed between neighboring bit lines BL. The storage node contact plug BC may be electrically connected to the second source/drain region 101b. A plurality of bottom electrodes BE may be disposed on corresponding storage node contact plugs BC. The bottom electrode BE may be covered with a dielectric layer DL. A top electrode TE may be disposed on the dielectric layer DL. The bottom electrodes BE, the dielectric layer DL, and the top electrode TE may constitute a plurality of capacitors. The top electrode TE may be covered with a fourth interlayer dielectric layer IL4. The fourth interlayer dielectric layer IL4 may have a single-layered or multi-layered structure including at least one selected from silicon oxide, silicon nitride, silicon oxynitride, and porous nitride.

The third conductive pads CP3 may be disposed on the fourth interlayer dielectric layer IL4. The second passivation layer PV2 may be disposed on the fourth interlayer dielectric layer IL4. The second passivation layer PV2 may have a single-layered or multi-layered structure including at least one selected from silicon oxide, silicon nitride, and silicon oxynitride.

The first calculation die CE1 may be disposed on the third memory die ME3. The first calculation die CE1 may be provided with first transistors TR1 on its fifth semiconductor substrate SSL5. The first transistor TR1 may be covered with a fifth interlayer dielectric layer IL5. The fifth interlayer dielectric layer IL5 may have a single-layered or multi-layered structure including at least one selected from a silicon oxide layer, a silicon nitride layer, a silicon oxynitride layer, a silicon carbonitride layer, and a porous dielectric layer. The fifth interlayer dielectric layer IL5 may have therein the internal lines IP electrically connected to the first transistors TR1. Calculation units may be constituted by the internal lines IP and the first transistors TR1 in the first calculation die CE1. In addition, some of the internal lines IP and the first transistors TR1 may constitute at least one selected from the peripheral region PERI, the row decoder ROW DEC, the read/write circuit R/W CIRCUIT, and the column decoder COL DEC that are excluded from the third memory die ME3. The sixth conductive pads CP6 may be disposed below the fifth interlayer dielectric layer IL5. A bottom surface of the fifth interlayer dielectric layer IL5 may be covered with the second passivation layer PV2.

Referring to FIG. 5, the third conductive pads CP3 may be in corresponding contact with corresponding sixth conductive pads CP6. In other words, each one of the third conductive pads CP3 may be in contact with a respective one of the sixth conductive pads CP6. The third conductive pads CP3 may each have a first width W1. The sixth conductive pads CP6 may each have a second width W2 greater than the first width W1. Thus, when the third memory die ME3 and the first calculation die CE1 are bonded to each other, it may be possible to prevent a misalignment between the third conductive pads CP3 and the sixth conductive pads CP6 and to increase a process margin.

The third memory die ME3 may further include first to third contact plugs (e.g., first to third contacts) MC1 to MC3 that penetrate the fourth interlayer dielectric layer IL4. The first contact plug MC1 may penetrate the fourth interlayer dielectric layer IL4 and the bit-line capping pattern 105 to connect one of the third conductive pads CP3 to an end of the bit line BL. The second contact plug MC2 may penetrate the fourth interlayer dielectric layer IL4, the pad dielectric layer 104, and the word-line capping pattern 103 to connect another of the third conductive pads CP3 to an end of the word line WL. The third contact plug MC3 may connect still another of the third conductive pads CP3 to the top electrode TE. A bottom end (e.g., a bottom surface) of the first contact plug MC1 may be higher than that of the second contact plug MC2 and lower than that of the third contact plug MC3.

Figure 6:
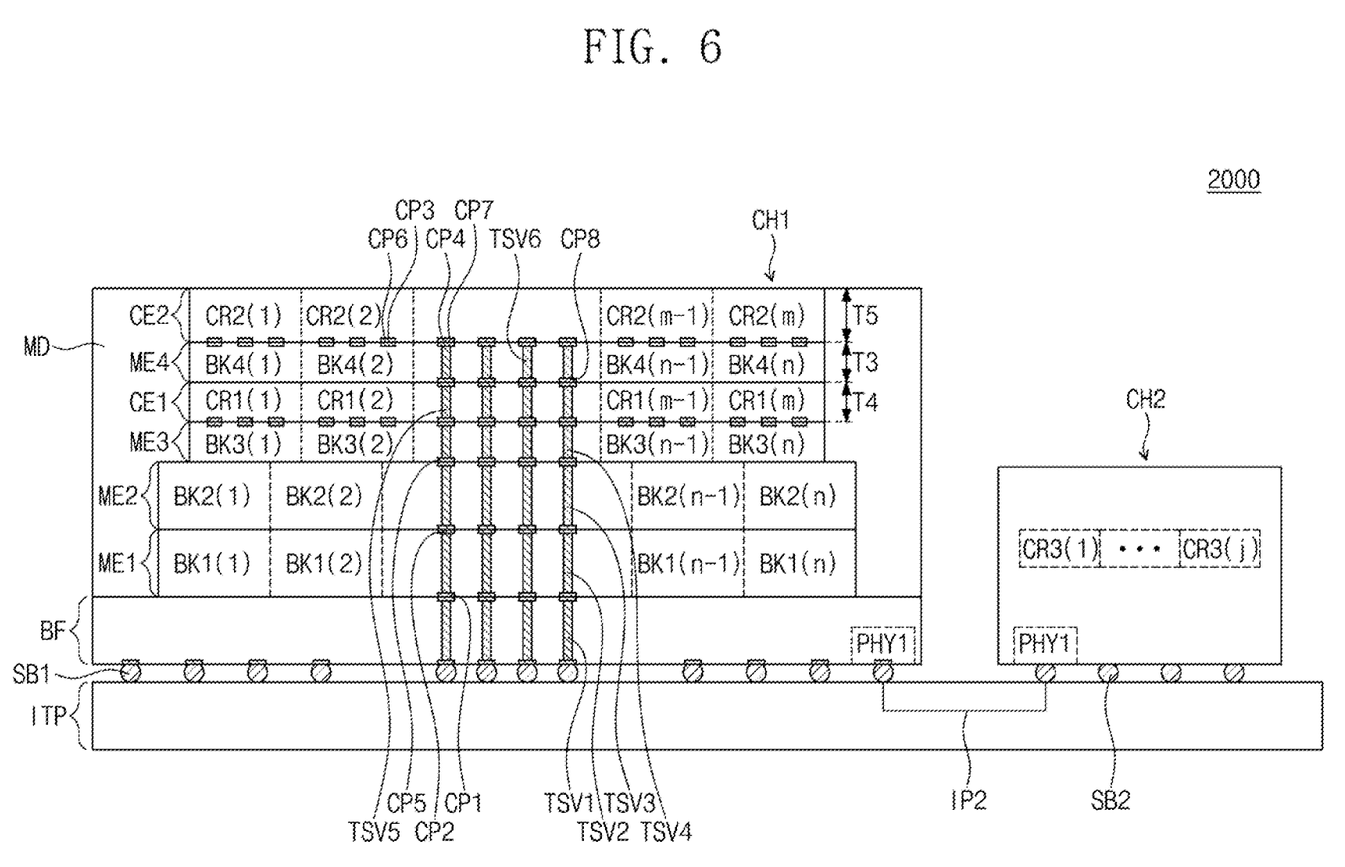
FIG. 6 illustrates a cross-sectional view showing a semiconductor package according to an example embodiment.

FIG. 6 illustrates a cross-sectional view showing a semiconductor package according to some embodiments.

Referring to FIG. 6, a semiconductor package 2000 according to an embodiment may be configured such that a first semiconductor chip CH1 and a second semiconductor chip CH2 are laterally mounted on an interposer substrate ITP. The first semiconductor chip CH1 may have a structure the same as or similar to that of the semiconductor package 1000 depicted in FIG. 1. In the first semiconductor chip CH1, sidewalls of the first and second memory dies ME1 and ME2 may not be aligned with those of the third and fourth memory dies ME3 and ME4. The first and second memory dies ME1 and ME2 may have their widths greater than those of the third and fourth memory dies ME3 and ME4. The buffer die BF may have a first physical layer region PHY1. The first semiconductor chip CH1 may be connected through first external connection members SB1 to the interposer substrate ITP. The interposer substrate ITP may be called a package substrate.

Each of the third and fourth memory dies ME3 and ME4 may have a third thickness T3. The first calculation die CE1 may have a fourth thickness T4. The second calculation die CE2 may have a fifth thickness T5. The fifth thickness T5 may be greater than one or both of the third thickness T3 and the fourth thickness T4.

The second semiconductor chip CH2 may be connected through second external connection members SB2 to the interposer substrate ITP. The second semiconductor chip CH2 may be a system-on-chip. The second semiconductor chip CH2 may be called a host or an application processor (AP). The second semiconductor chip CH2 may be called a third calculation die. The second semiconductor chip CH2 may include a memory controller that controls the first and second memory dies ME1 and ME2 and performs data input/output with the first and second memory dies ME1 and ME2. The memory controller may use a direct memory access (DMA) manner to access the first and second memory dies ME1 and ME2. The second semiconductor chip CH2 may have a second physical layer region PHY2. The second semiconductor chip CH2 may further include j third calculation blocks CR3, where j may be a natural number that is the same as or different from the n or the m. The interposer substrate ITP may include second internal lines IP2 that connect the first physical layer region PHY1 and the second physical layer region PHY2 to each other.

The third calculation blocks CR3 of the second semiconductor chip CH2 may include one or more calculation units. The calculation units may perform calculation, such as max pooling, rectified linear unit (ReLU), and channel-wise addition. The third calculation blocks CR3 of the second semiconductor chip CH2 may calculate data received from the first and second memory blocks BK1 and BK2 of the first and second memory dies ME1 and ME2, and may store results back to the first and second memory blocks BK1 and BK2 of the first and second memory dies ME1 and ME2.

Figure 7:
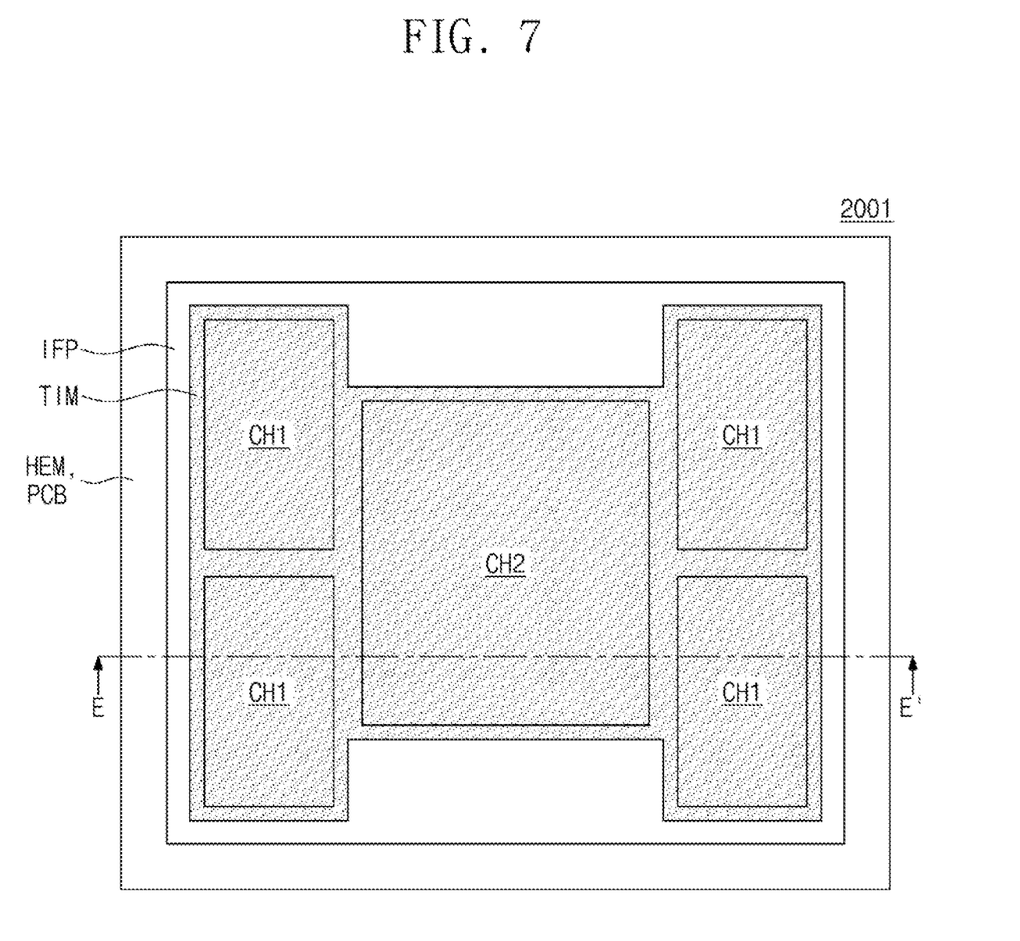
FIG. 7 illustrates a plan view showing a semiconductor package according to an example embodiment.
Figure 8:
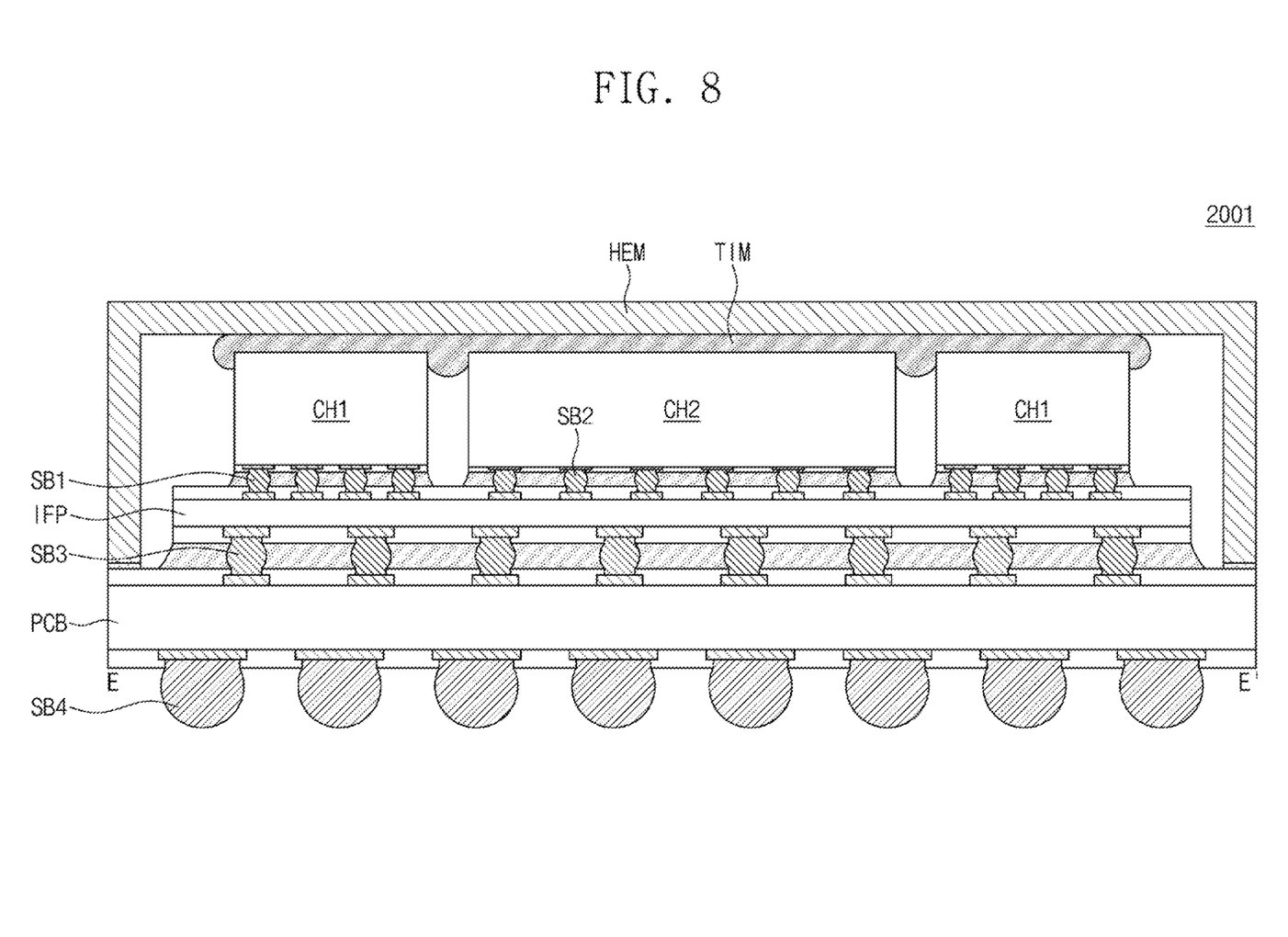
FIG. 8 illustrates a cross-sectional view taken along line E-E' of FIG. 7.

FIG. 7 illustrates a plan view showing a semiconductor package according to some embodiments. FIG. 8 illustrates a cross-sectional view taken along line E-E' of FIG. 7.

Referring to FIGS. 7 and 8, a semiconductor package 2001 according to an embodiment may be configured such that an interposer substrate IFP is disposed on a package substrate PCB. The package substrate PCB may be, for example, a bi-layered or multi-layered printed circuit board. The interposer substrate IFP may include, for example, silicon. The interposer substrate IFP may be bonded through third external connection members SB3 to the package substrate PCB. Fourth external connection members SB4 may be bonded to a bottom end of the package substrate PCB. Four first semiconductor chips CH1 and one second semiconductor chip CH2 may be disposed on the interposer substrate IFP. Two first semiconductor chips CH1 may be disposed on each of both sides of the second semiconductor chip CH2.

Each of the first semiconductor chips CH1 may be the same as or similar to the semiconductor package 1000 or the first semiconductor chip CH1 discussed with reference to FIGS. 1 to 6. The second semiconductor chip CH2 may be the same as or similar to the second semiconductor chip CH2 discussed with reference to FIG. 6. The interposer substrate IFP may have therein the second internal lines IP2 which are discussed with reference to FIG. 6 and connect the second semiconductor chip CH2 to the first semiconductor chips CH1.

The first semiconductor chips CH1 and the second semiconductor chip CH2 may be covered with a thermal radiation member HEM. The thermal radiation member HEM may also cover the interposer substrate IFP and the package substrate PCB. The thermal radiation member HEM may include metal whose thermal conductivity is high, such as titanium, copper, tungsten, or aluminum. The thermal radiation member HEM may serve as an electromagnetic interference shield. A thermal interface material layer TIM may be disposed between the thermal radiation member HEM and the first semiconductor chips CH1 and between the thermal radiation member HEM and the second semiconductor chip CH2. The thermal interface material layer TIM may include grease or a thermosetting resin layer. The thermal interface material layer TIM may further include filler particles dispersed in the thermosetting resin layer. The filler particles may include a graphene powder or a metal powder whose thermal conductivity is high. Alternatively, the filler particles may include at least one selected from silica, alumina, zinc oxide, and boron nitride.

The thermal interface material layer TIM may be in contact with a top surface of the second calculation die CE2 of the first semiconductor chip CH1 depicted in FIG. 6. Therefore, heat generated from the second calculation die CE2 may be easily discharged through the thermal interface material layer TIM and the thermal radiation member HEM. Accordingly, the semiconductor package 2001 may increase in reliability and operating speed.

In a semiconductor package according to some embodiments of the disclosure, conductive pads may be used to place a calculation die directly on a memory die, and the calculation die may calculate data received from the memory die and then may write a result to the memory die. Thus, a distance between the memory die and the calculation die may be reduced to increase a signal processing speed and/or an operating speed. In addition, the memory dies may be provided thereon with the calculation dies whose amount of thermal radiation is greater than that of the memory dies, and therefore the semiconductor package may be effective in terms of thermal radiation. As a result, the semiconductor package may increase in reliability and operating speed.

Although the disclosure has been described in connection with some embodiments illustrated in the accompanying drawings, it will be understood to those skilled in the art that various changes and modifications may be made without departing from the technical spirit and essential feature of the disclosure. It will be apparent to those skilled in the art that various substitution, modifications, and changes may be thereto without departing from the scope and spirit of the disclosure.

What is claimed is:

1. A semiconductor package comprising:
   a buffer die; and
   a first semiconductor die and a second semiconductor die that are sequentially stacked on the buffer die,
   wherein the first semiconductor die comprises:
      a first semiconductor substrate;
      a plurality of first memory blocks provided on the first semiconductor substrate;
      a first interlayer dielectric layer that covers the first semiconductor substrate and the plurality of first memory blocks;
      a first through via that penetrates the first semiconductor substrate and is connected to the buffer die; and
      a plurality of first conductive pads provided on the first interlayer dielectric layer and connected to the plurality of first memory blocks,
   wherein the second semiconductor die comprises:
      a second semiconductor substrate;
      a plurality of first calculation blocks provided on the second semiconductor substrate, the plurality of first calculation blocks being configured to calculate data received from the plurality of first memory blocks and store calculated results in the plurality of first memory blocks;
      a second interlayer dielectric layer that covers the second semiconductor substrate and the plurality of first calculation blocks; and
      a plurality of second conductive pads provided below the second interlayer dielectric layer and connected to the plurality of first calculation blocks,
   wherein a top surface of the first interlayer dielectric layer contacts the second interlayer dielectric layer, and
   wherein each first conductive pad of the plurality of first conductive pads contacts a corresponding second conductive pad of the plurality of second conductive pads.

2. The semiconductor package of claim 1, further comprising:
   a thermal radiation member provided adjacent to the second semiconductor die; and
   a thermal interface material layer provided between the second semiconductor die and the thermal radiation member.

3. The semiconductor package of claim 1, further comprising:
   a third semiconductor die provided between the buffer die and the first semiconductor die; and
   a fourth semiconductor die provided between the third semiconductor die and the first semiconductor die,
   wherein the third semiconductor die comprises:
      a third semiconductor substrate;
      a plurality of second memory blocks provided on the third semiconductor substrate;
      a third interlayer dielectric layer that covers the third semiconductor substrate and the plurality of second memory blocks;
      a second through via that penetrates the third semiconductor substrate and is connected to the buffer die; and
      a plurality of third conductive pads provided on the third interlayer dielectric layer and connected to the plurality of second memory blocks,
   wherein the fourth semiconductor die comprises:

a fourth semiconductor substrate;
a plurality of second calculation blocks provided on the fourth semiconductor substrate, the plurality of second calculation blocks being configured to calculate data received from the plurality of second memory blocks and store calculated results in the plurality of second memory blocks,
a fourth interlayer dielectric layer that covers the fourth semiconductor substrate and the plurality of second calculation blocks;
a third through via that penetrates the fourth semiconductor substrate and is connected to the buffer die; and
a plurality of fourth conductive pads provided below the fourth interlayer dielectric layer and connected to the plurality of second calculation blocks,
wherein a top surface of the third interlayer dielectric contacts the fourth interlayer dielectric layer, and
wherein each third conductive pad of the plurality of third conductive pads contacts a corresponding fourth conductive pad of the plurality of fourth conductive pads.

4. The semiconductor package of claim 3, wherein the fourth semiconductor substrate has a first thickness, and
the second semiconductor substrate has a second thickness that is greater than the first thickness.

5. The semiconductor package of claim 1, further comprising:
an interposer substrate provided below the buffer die;
at least one third semiconductor die provided between the first semiconductor die and the buffer die; and
a fourth semiconductor die provided on the interposer substrate and on a side of the buffer die,
wherein the third semiconductor die comprises a plurality of second memory blocks, and
wherein the fourth semiconductor die comprises a plurality of second calculation units configured to calculate data received from the plurality of second memory blocks and store calculated results in the plurality of second memory blocks.

6. The semiconductor package of claim 1, wherein each of the plurality of first memory blocks comprises:
a plurality of word lines that are buried in the first semiconductor substrate and are parallel to each other;
a plurality of bit lines provided on the first semiconductor substrate, each of the plurality of bit lines running across the plurality of word lines;
a plurality of storage node contacts provided between adjacent bit lines of the plurality of bit lines;
a plurality of bottom electrodes provided on the plurality of storage node contacts;
a dielectric layer that conformally covers the plurality of bottom electrodes; and
a top electrode provided on the dielectric layer.

7. The semiconductor package of claim 6, wherein the first semiconductor die further comprises:
a plurality of first contacts that penetrate the first interlayer dielectric layer and connect the plurality of bit lines to at least one of the plurality of first conductive pads; and
a plurality of second contacts that penetrate the first interlayer dielectric layer and connect the plurality of word lines to at least another one of the plurality of first conductive pads, and
wherein bottom surfaces of the plurality of second contacts are lower than bottom surfaces of the plurality of first contacts.

8. A semiconductor package comprising:
a package substrate;
an interposer substrate provided on the package substrate;
a buffer die provided on the interposer substrate;
a first memory die and a second memory die that are sequentially stacked on the buffer die;
a third memory die, a first calculation die, a fourth memory die, and a second calculation die that are sequentially stacked on the second memory die;
a third calculation die provided on the interposer substrate and on a side of the buffer die;
a thermal radiation member provided on the second calculation die and the third calculation die; and
a thermal interface material layer provided between the second calculation die and the thermal radiation member and between the third calculation die and the thermal radiation member,
wherein the third memory die comprises a plurality of first memory blocks,
wherein the first calculation die comprises a plurality of first calculation blocks configured to calculate data received from the plurality of first memory blocks and store calculated results in the plurality of first memory blocks,
wherein the fourth memory die comprises a plurality of second memory blocks, and
wherein the second calculation die comprises a plurality of second calculation blocks, and the plurality of second calculation blocks calculate data received from the plurality of second memory blocks and store calculated results in the plurality of second memory blocks.

9. The semiconductor package of claim 8, wherein the first calculation die has a first thickness, and
the second calculation die has a second thickness that is greater than the first thickness.

10. The semiconductor package of claim 8, wherein the third memory die further comprises:
a first semiconductor substrate on which the plurality of first memory blocks are provided;
a first interlayer dielectric layer that covers the first semiconductor substrate and the plurality of first memory blocks;
a first through via that penetrates the first semiconductor substrate and is connected to the buffer die; and
a plurality of first conductive pads provided on the first interlayer dielectric layer and connected to the plurality of first memory blocks,
wherein the first calculation die further comprises:
a second semiconductor substrate on which the plurality of first calculation blocks are provided;
a second interlayer dielectric layer that covers the second semiconductor substrate and the plurality of first calculation blocks; and
a plurality of second conductive pads provided below the second interlayer dielectric layer and connected to the plurality of first calculation blocks,
wherein a top surface of the first interlayer dielectric layer contacts the second interlayer dielectric layer, and
wherein each first conductive pad of the plurality of first conductive pads contacts a corresponding second conductive pad of the plurality of second conductive pads.

11. The semiconductor package of claim 10, wherein the fourth memory die further comprises:
a third semiconductor substrate on which the plurality of second memory blocks are provided;
a third interlayer dielectric layer that covers the third semiconductor substrate and the plurality of second memory blocks;

a second through via that penetrates the third semiconductor substrate and is connected to the buffer die; and
a plurality of third conductive pads on the third interlayer dielectric layer and connected to the plurality of second memory blocks,
wherein the second calculation die further comprises:
a fourth semiconductor substrate on which the plurality of second calculation blocks are provided;
a fourth interlayer dielectric layer that covers the fourth semiconductor substrate and the plurality of second calculation blocks; and
a plurality of fourth conductive pads provided below the fourth interlayer dielectric layer and connected to the plurality of second calculation blocks,
wherein a top surface of the third interlayer dielectric layer contacts the fourth interlayer dielectric layer, and
wherein the plurality of third conductive pads contact the plurality of fourth conductive pads.

12. The semiconductor package of claim 8, wherein each of the plurality of first memory blocks and each of the plurality of second memory blocks comprises:
a plurality of word lines;
a plurality of bit lines that run across the plurality of word lines;
a plurality of storage node contacts provided between adjacent bit lines of the plurality of bit lines;
a plurality of bottom electrodes provided on the plurality of storage node contacts;
a dielectric layer that conformally covers the plurality of bottom electrodes; and
a top electrode provided on the dielectric layer.

13. The semiconductor package of claim 12, wherein each of the plurality of first memory blocks and the plurality of second memory blocks further comprises:
a plurality of first contacts connected to ends of the plurality of bit lines; and
a plurality of second contacts connected to ends of the plurality of word lines, and
wherein bottom surfaces of the plurality of second contacts are lower than bottom surfaces of the plurality of first contacts.

14. A semiconductor package comprising:
a buffer die; and
a first memory die, a first calculation die, a second memory die, and a second calculation die that are sequentially stacked on the buffer die,
wherein the first memory die comprises a plurality of first memory blocks,
wherein the first calculation die comprises a plurality of first calculation blocks configured to calculate data received from the plurality of first memory blocks and store calculated results in the plurality of first memory blocks,
wherein the second memory die comprises a plurality of second memory blocks,
wherein the second calculation die comprises a plurality of second calculation blocks configured to calculate data received from the plurality of second memory blocks and store calculated results in the plurality of second memory blocks,
wherein each of the first memory die and the second memory die has a first thickness,
wherein the first calculation die has a second thickness, and
wherein the second calculation die has a third thickness that is greater than the first thickness and the second thickness.

15. The semiconductor package of claim 14, further comprising:
a thermal radiation member provided adjacent to the second calculation die; and
a thermal interface material layer provided between the second calculation die and the thermal radiation member.

16. The semiconductor package of claim 14,
wherein the first memory die further comprises:
a first semiconductor substrate on which the plurality of first memory blocks are provided;
a first interlayer dielectric layer that covers the first semiconductor substrate and the plurality of first memory blocks;
a first through via that penetrates the first semiconductor substrate and is connected to the buffer die; and
a plurality of first conductive pads provided on the first interlayer dielectric layer and connected to the plurality of first memory blocks,
wherein the first calculation die further comprises:
a second semiconductor substrate on which the plurality of first calculation blocks are provided;
a second interlayer dielectric layer that covers the second semiconductor substrate and the plurality of first calculation blocks; and
a plurality of second conductive pads provided below the second interlayer dielectric layer and connected to the plurality of first calculation blocks,
wherein a top surface of the first interlayer dielectric layer contacts the second interlayer dielectric layer, and
wherein each first conductive pad of the plurality of first conductive pads contacts a corresponding second conductive pad of the plurality of second conductive pads.

17. The semiconductor package of claim 16, wherein the second memory die further comprises:
a third semiconductor substrate on which the plurality of second memory blocks are disposed;
a third interlayer dielectric layer that covers the third semiconductor substrate and the plurality of second memory blocks;
a second through via that penetrates the third semiconductor substrate and is connected to the buffer die; and
a plurality of third conductive pads provided on the third interlayer dielectric layer and connected to the plurality of second memory blocks,
wherein the second calculation die further comprises:
a fourth semiconductor substrate on which the plurality of second calculation blocks are provided;
a fourth interlayer dielectric layer that covers the fourth semiconductor substrate and the plurality of second calculation blocks; and
a plurality of fourth conductive pads provided below the fourth interlayer dielectric layer and connected to the plurality of second calculation blocks,
wherein a top surface of the third interlayer dielectric layer contacts the fourth interlayer dielectric layer, and
wherein each third conductive pad of the plurality of third conductive pads contacts a corresponding fourth conductive pad of the plurality of fourth conductive pads.

18. The semiconductor package of claim 14, wherein each of the plurality of first memory blocks and the plurality of second memory blocks further comprises:
a plurality of word lines;
a plurality of bit lines that run across the plurality of word lines;
a plurality of storage node contacts provided between adjacent bit lines of the plurality of bit lines;

a plurality of bottom electrodes provided on the plurality of storage node contacts;

a dielectric layer that conformally covers the plurality of bottom electrodes; and a top electrode provided on the dielectric layer.

19. The semiconductor package of claim 18, wherein each of the plurality of first memory blocks and the plurality of second memory blocks further comprises:

a plurality of first contacts connected to ends of the plurality of bit lines; and a plurality of second contacts connected to ends of the plurality of word lines, and wherein bottom surfaces of the plurality of second contacts are lower than bottom surfaces of the plurality of first contacts.

20. The semiconductor package of claim 14, further comprising:

an interposer substrate provided below the buffer die;

a package substrate provided below the interposer substrate;

at least one third memory die provided between the first memory die and the buffer die; and a third calculation die provided on the interposer substrate and on a side of the buffer die, wherein the at least one third memory die comprises a plurality of third memory blocks, wherein the third calculation die is configured to calculate data received from the plurality of third memory blocks and store calculated results in the plurality of third memory blocks.

* * * * *